(12) United States Patent
Shiraishi

(10) Patent No.: US 7,618,898 B2
(45) Date of Patent: Nov. 17, 2009

(54) METHOD AND APPARATUS FOR FORMING CONTACT HOLE

(75) Inventor: Hitoshi Shiraishi, Tokyo (JP)

(73) Assignee: NEC Corporation, Tokyo (JP)

( * ) Notice: Subject to any disclaimer, the term of this patent is extended or adjusted under 35 U.S.C. 154(b) by 615 days.

(21) Appl. No.: 11/092,611

(22) Filed: Mar. 30, 2005

(65) Prior Publication Data

US 2005/0221614 A1    Oct. 6, 2005

(30) Foreign Application Priority Data

Mar. 31, 2004  (JP) ............................. 2004-104627

(51) Int. Cl.
*H01L 21/302* (2006.01)
*H01L 21/461* (2006.01)

(52) U.S. Cl. .................... 438/751; 216/17; 438/689

(58) Field of Classification Search ................. 438/689, 438/751, 149; 216/39, 13, 17, 19; 257/347, 257/E21.232, E21.229, E21.218
See application file for complete search history.

(56) References Cited

U.S. PATENT DOCUMENTS

| 6,365,057 | B1 * | 4/2002 | Whitehurst et al. | ........... 216/13 |
| 6,485,654 | B1 * | 11/2002 | Liu et al. | ....................... 216/13 |
| 6,660,652 | B2 * | 12/2003 | Kim et al. | .................... 438/734 |
| 6,673,704 | B2 * | 1/2004 | Wada et al. | .................. 438/540 |
| 6,693,044 | B1 * | 2/2004 | Yamazaki et al. | ........... 438/745 |
| 6,933,988 | B2 * | 8/2005 | Ohgami et al. | ................. 349/39 |
| 2004/0175944 | A1 * | 9/2004 | Kobayashi | .................. 438/689 |
| 2004/0219687 | A1 * | 11/2004 | Torii et al. | ................... 436/174 |
| 2008/0283930 | A1 * | 11/2008 | Dyer et al. | ................... 257/371 |

FOREIGN PATENT DOCUMENTS

| JP | 11-111988 | 4/1999 |
| JP | 2001-274411 | 10/2001 |

* cited by examiner

*Primary Examiner*—Walter L Lindsay, Jr.
(74) *Attorney, Agent, or Firm*—McGinn IP Law Group, PLLC

(57) ABSTRACT

A method of forming a contact hole in an insulating film coating amorphous Si having an irregular surface formed on an insulating substrate, for connecting the amorphous Si to a conductor film formed on the insulating film, including: etching the insulating film using reactive ion etching to a depth whereat said irregularity does not disappear; and sputter-etching the surface of the amorphous Si.

5 Claims, 9 Drawing Sheets

METHOD AND APPARATUS FOR FORMING CONTACT HOLE

BACKGROUND OF THE INVENTION

1. Fields of the Invention

The present invention relates to a method and an apparatus for forming an ohmic contact to a metallization layer in an insulating film on an amorphous Si, which is an active layer, particularly in a method for manufacturing thin film devices on a glass substrate.

2. Description of the Related Art

Thin film semiconductor devices have been widely used as pixel drivers for displays in wide-screen displays, personal computers, mobile phones and the like. Among amorphous silicon, polycrystalline silicon (hereafter abbreviated as poly-Si) is promising as the material for the semiconductor layers of the thin film semiconductor devices. This is because poly-Si has high mobility, and favorable switching characteristics can be obtained. The method for manufacturing a thin film semiconductor device using poly-Si is similar to the conventional method for manufacturing an Si semiconductor device.

However, the process for forming a thin film semiconductor device is different from the process for forming a conventional Si semiconductor device, in that the Si semiconductor device uses an Si substrate, while the thin film semiconductor device uses a glass substrate, and uses laser annealing for poly-crystallizing an Si thin film. Therefore, the thin film semiconductor process has inherent problems that do not arise in the conventional Si semiconductor process.

One of the exemplary problems is that it is difficult to get sufficiently low contact resistance at contact hole. The contact hole is normally formed by opening a contact hole in an insulating film coating a thin film semiconductor, which becomes an active layer, using etching; burying an upper wiring therein; and connecting the upper wiring to the thin film semiconductor.

As described above, since poly-Si is undergone laser annealing, the surface thereof is not planarized, and has an irregular structure depending on the intensity distribution of the laser. Therefore, the insulating film formed in the concave portions of the poly-Si surface cannot be completely removed by etching, and often remains in the concave portions, causing the elevation of contact resistance. In such an irregular structure, byproducts of etching are also easily accumulated, causing the further elevation of contact resistance. In order to solve the problem, contact holes were conventionally formed by the combined use of dry etching and wet etching. This will be specifically described referring to FIGS. 5 (a)-5 (d).

First, as FIG. 5 (a) shows, an Si oxide film 102 of a thickness of about 300 nm is formed on a glass substrate 101, and an active layer Si film 103 of a thickness of 60 nm is formed thereon. Then, excimer laser beams are irradiated on the surface of the active layer Si film 103, and is crystallized to form a poly-Si film.

Next, an Si oxide film 104 of a thickness of 50 nm is formed, and a micro-crystalline silicon (μc-Si) film 105 and a Cr film 106 are formed in this order as a gate wiring. Here, the thickness of the μc-Si film 105 is 100 nm, and the thickness of the Cr film 106 is 200 nm.

Next, the μc-Si film 105 and the Cr film 106 are patterned by photolithography to form a gate electrode. Next, an Si oxide film of a thickness of 100 nm is formed thereon, and heat treatment at a temperature of 350° C. or above is performed to lower the resistance of the poly-Si film. Then, an Si oxide film of a thickness of 300 nm is further formed to form an interlayer film 107 of a total thickness of 400 nm.

Therefore, the thickness of the interlayer insulating film on the gate electrode becomes 400 nm, and the film thickness on the active layer Si film 103 becomes the sum of the thicknesses of the Si oxide film 104 and the Si oxide film 107, i.e., 450 nm.

Next, as FIG. 5 (b) shows, contact opening is performed in the interlayer film 107 to the Cr film 106 and to the active layer Si film 103. The $SiO_2$ film is etched by reactive etching using a photoresist film 108 as a mask to open contact holes extending to the Cr film 106 and to the active layer Si film 103, respectively. Here, since the thickness of the Si oxide film on the active layer Si film 103 is 450 nm, while the thickness of the Si oxide film on the Cr film 106 is 400 nm, the contact hole on the gate Cr is first opened by the etching. Although the contact hole on the Cr film 106 is over-etched when the contact hole on the active layer Si film 103 is formed, the Cr film 106 is not etched at all if the $CHF_3+O_2$ gas 109 is used as the etching gas. Therefore, excessive removal by over-etching does not occur.

The method for removing the Si oxide film using $CHF_3+O_2$ as the etching gas is described in Japanese Patent Application Publication No. 2001-274411A. The fluorocarbon-based byproducts of the etching 110 deposited on the active layer Si film 103 during etching are removed by wet etching 111 using buffered hydrofluoric acid as FIG. 5 (c) shows.

The method to use hydrofluoric acid-based etchant for thus removing the fluorocarbon-based byproducts of the etching on the active layer Si film is described in Japanese Patent Application Publication No. 11-111988A.

Finally, as FIG. 5 (d) shows, after peeling off the photoresist film, transferring the glass substrate 101 into the sputtering apparatus, performing AlSi sputtering 112, and forming an AlSi film as a drain wiring, a gate Cr/Al contact 113 and an Si active layer/Al contact 114 are buried, and the Cr film 106 is connected to the active layer Si film 103 by the AlSi film.

Here, the time from the wet etching step using BHF shown in FIG. 5 (c) to the AlSi sputtering step shown in FIG. 5 (d) must be one day or less so as to prevent the formation of a surface-oxidized silicon film. This is because the time when the Si surface is H-terminated by the etching, and the formation of a surface-oxidized silicon film is suppressed at longest for about 24 hours.

In a conventional process for forming contact holes, as described above, two types of etching, ion etching and wet etching, are performed on the insulating film on an active layer Si film. However, the irregularity on the surface of the active layer Si film cannot be completely planarized.

Particularly, it is extremely difficult to remove the Si oxide film remaining under the byproducts of the etching. Therefore, the contact resistance cannot be controlled at high reproducibility. In particular, this effect is significant in the case of fine contact patterns, resulting in a defective contact. To avoid this problem, a method to set the endpoint of dry etching on the active layer Si film has been used. This will be described referring to FIGS. 6 (a)-6 (d) showing an enlarged contact hole area on the active layer Si film. As FIG. 6 (a) shows, the surface of the active layer Si film 103 has an irregular structure with a height difference of about 20 nm after the radiation of the excimer laser. To control Si oxide films remaining in the concave portion, the endpoint of dry etching shown in FIG. 6 (b) is the depth wherein the active layer Si film 103 is partly over-etched. By etching to this depth, the irregularity of the surface of the active layer Si film 103 is reduced, and the Si oxide films 115 remaining in the concave portion shown in FIG. 6 (b) can be easily removed by BHF wet etching together with the byproducts of the etching 110 as shown in FIG. 6 (c). Finally, as FIG. 6 (d) shows, the gate Cr/Al contact 113 is connected to the Si active layer/Al contact 114 by forming the AlSi sputtered film after removing the photoresist film 108. Here, the thickness of the active layer Si film 103 is 60 nm, and although an impurity phosphorus (hereafter, abbreviated as P) is distributed down to the depth of about 20 nm, the P concentration lowers sharply in the deeper portion (FIG. 7).

Therefore, the region where the removal by over-etching is allowed is limited to the depth of about 20 nm from the surface. The accuracy of controlling the etching depth in dry etching is at most 100 nm, and such accurate controlling is considerably difficult. When the daily fluctuation of the etching rate and change of the apparatus itself over time are considered, the optimization of etching time for every etching is required. Thus, the lowering of throughput and increase in manufacturing costs due to such process optimization is inevitable.

SUMMARY OF THE INVENTION

In view of the foregoing and other exemplify problems, disadvantages and drawbacks, an exemplary feature of the present invention is to provide a method and an apparatus for forming low-resistance contact holes at high productivity even on an insulating film on a thin active layer Si film having an irregular surface.

According to the present invention, there is provided a method for forming a contact hole in an insulating film coating amorphous Si having an irregular surface formed on an insulating substrate, for connecting the amorphous Si to a conductor film formed on the insulating film, including etching the insulating film using reactive ion etching to a depth whereat the irregularity does not disappear;
removing the byproduct of the reactive ion etching using wet etching; and
sputter-etching the surface of the amorphous Si.

According to this exemplary method, since reactive ion etching is stopped on the surface of the amorphous Si, over-etching is not required, and the accurate control of etching depth becomes unnecessary. Although most of the deposits produced in the step of reactive ion etching can be removed by following wet etching, the Si oxide film in fine concave portions are often left. Such residual Si oxide films can be physically removed by sputter etching for colliding Ar molecules to the surface to pare off the surface layer.

Therefore, the excessive removal of the active layer Si film is not required in reactive ion etching, and the detection of the endpoint of the etching can be accurately controlled. The wet etching process is not necessary in the case of substantially no deposits produced in the reactive ion etching.

In another exemplary aspect, according to the present invention, there is provided another exemplary method for forming a contact hole in an insulating film coating amorphous Si having an irregular surface formed on an insulating substrate, for connecting the amorphous Si to a conductor film formed on the insulating film, including, etching the insulating film using reactive ion etching to a depth whereat the irregularity is not disappear;
removing the byproduct of the reactive ion etching using wet etching;
sputter-etching the surface of the amorphous Si; and
a step for forming a metallic film using sputtering.

According to this exemplary method, since the surface of amorphous Si is exposed by sputtering, and then a thin metallic film is formed by sputtering, the productivity of contact formation is improved.

In reactive ion etching according to the present invention, a fluorine-based gas can be exemplary used.

The use of this etching gas enables the etching selective ratio of a metal to Si to be low, and there is no danger to corrode the metal surface in the etching of Si.

In wet etching according to the present invention, buffered hydrofluoric acid can be exemplarily used.

The use of buffered hydrofluoric acid enables the etching selective ratio of Si to $SiO_2$ to be low, and there is no danger to corrode Si surface in the etching of $SiO_2$. The wet etching process is not necessary in the case of substantially no deposits produced in the reactive ion etching.

According to the present invention, there is provided an exemplary contact hole forming method, wherein after the completion of the sputter etching, the substrate is transferred into a film-forming chamber through a transfer path maintained in a vacuum state, or a state filled with an inert gas, and the metallic film is formed.

According to this exemplary method, since a metallic film can be formed in the state where no natural oxide film has been formed on the surface of amorphous Si, the contact resistance can be lowered.

According to another exemplary aspect of the present invention, there is provided an exemplary contact hole forming apparatus for forming a contact hole in an insulating film coating amorphous Si having an irregular surface formed on an insulating substrate, for connecting the amorphous Si to a conductor film formed on the insulating film, including:

an etching chamber that forms sputter etching;
a film-forming chamber that performs a metallic film; and
a transfer mechanism that transfers the glass substrate from the etching chamber to the film-forming chamber in a vacuum state, or in a state filled with an inert gas.

Since this apparatus enables the metallic film to be formed in the state where no natural oxide film is formed on the surface of amorphous Si, the contact resistance can be lowered.

In yet another exemplary aspect, according to the present invention, there is provided an exemplary Si device wherein the surface roughness of the amorphous Si in the contacting portion of the wiring and the amorphous Si layer is 10 nm or below. Here, the surface roughness means the maximum value of height difference of the surface irregularity.

In this device, since the height difference of irregularity of the Si surface is small, and the Si oxide film does not remain in the boundary, the contact resistance can be lowered.

According to a still further exemplary aspect of the present invention, there is provided a exemplary liquid crystal display including the amorphous Si device wherein the surface roughness of the amorphous Si in the contacting portion of the wiring and the amorphous Si layer is 10 nm or below, in a liquid crystal drive circuit.

In this apparatus, since the contact resistance can be lowered in the amorphous Si device, power consumption can be lowered.

DETAILED DESCRIPTION OF THE EXEMPLARY EMBODIMENTS OF THE INVENTION

First Embodiment

Figure 1A:
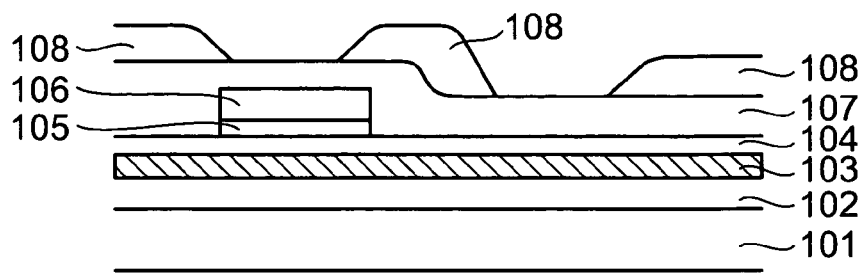
FIGS. 1 (a)~(e) are process sectional views illustrating the manufacturing flow of a thin film transistor formed using a method for manufacturing a thin film transistor according to a first exemplary embodiment of the present invention.
Figure 1B:
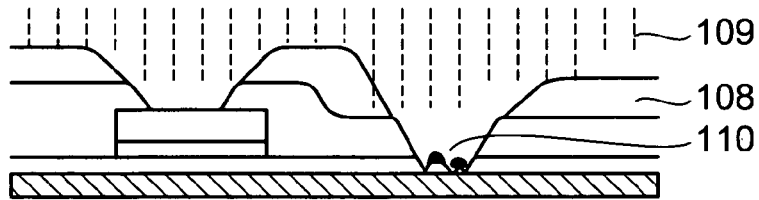
Figure 1C:
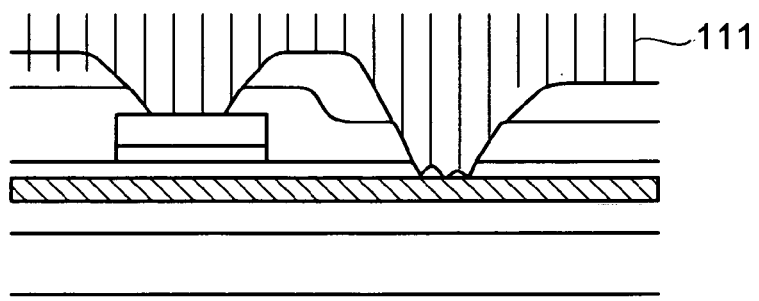
Figure 1D:
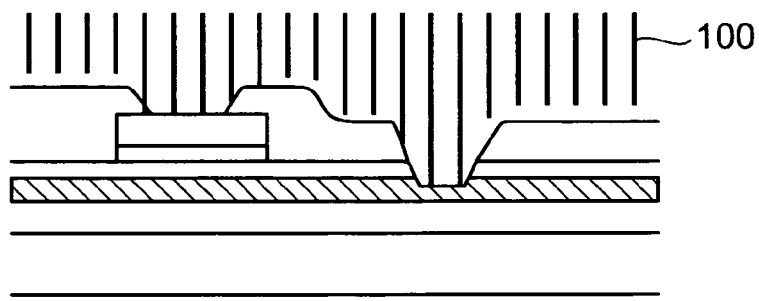
Figure 1E:
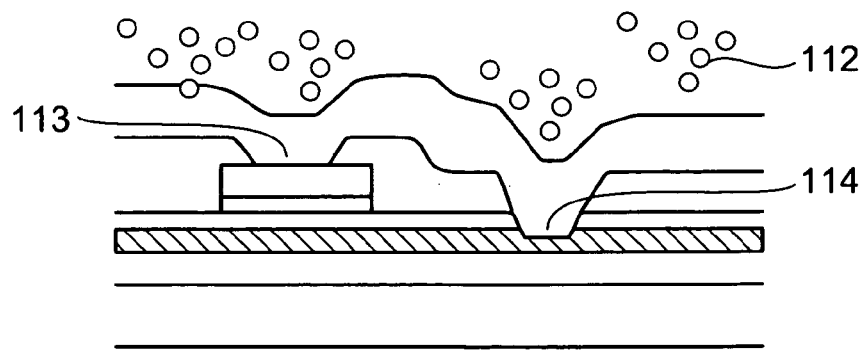

The process sectional views illustrating the flow of manufacturing a thin film transistor according to a first exemplary embodiment of the present invention are shown in FIGS. 1 (a)-1 (e). As FIG. 1 (a) shows, an Si oxide film 102 of a thickness of about 300 nm is formed on a glass substrate 101, an active layer Si film 103 as an active layer of a thickness of 60 nm is formed thereon, and the Si film is crystallized using an excimer laser to form a polycrystalline silicon (poly-Si) film. It is noted that all thicknesses and operating conditions/parameters stated herein are exemplary and non-limiting as would be evident to one of ordinary skill in the art taking the present application as a whole.

Next, as an interlayer insulating film, an Si oxide film 104 of a thickness of 50 nm is formed, a micro-crystal silicon (μc-Si) film 105 and a Cr film 106 of thicknesses of 100 nm and 200 nm, respectively, are formed in this order as gate wiring materials, and they are patterned to desired shapes to form a gate electrode. Thereafter, an interlayer Si oxide film of a thickness of 100 nm is further formed, and heat-treated at a temperature of 350° C. or above to activate the active layer Si film 103 to lower the resistance thereof.

After the above-described step, an interlayer Si oxide film of a thickness of 300 nm is further formed to form an Si oxide film having a total thickness of 400 nm is formed as an interlayer film 107.

Next, the contact opening in the interlayer film will be described below. As FIG. 1 (b) shows, the Si oxide film is etched by reactive ion etching to the surface of the Cr film 106 and the surface of the active layer Si film 103, using a photoresist 108 as a mask, and using a mixed gas of $CHF_3$ and $O_2$ as an etching gas 109, to open the contacts.

The exemplary conditions at this time are an etching pressure of 2 Pa; an RF power of 1500 W; and an etchant-gas flow rate of 150 sccm. The etching time is a value of the thickness of the interlayer film divided by the mean value of the etching rate routinely measured under the same conditions. In this case, since the mean value of the etching rate was 60 nm/min, and the film thickness was 450 nm, the etching time was decided to be 450 seconds. If the etching rate is fluctuated, then the etching time is calculated using the upper limit of the etching rate to avoid excessive etching of the active layer Si film 103.

Figure 3A:
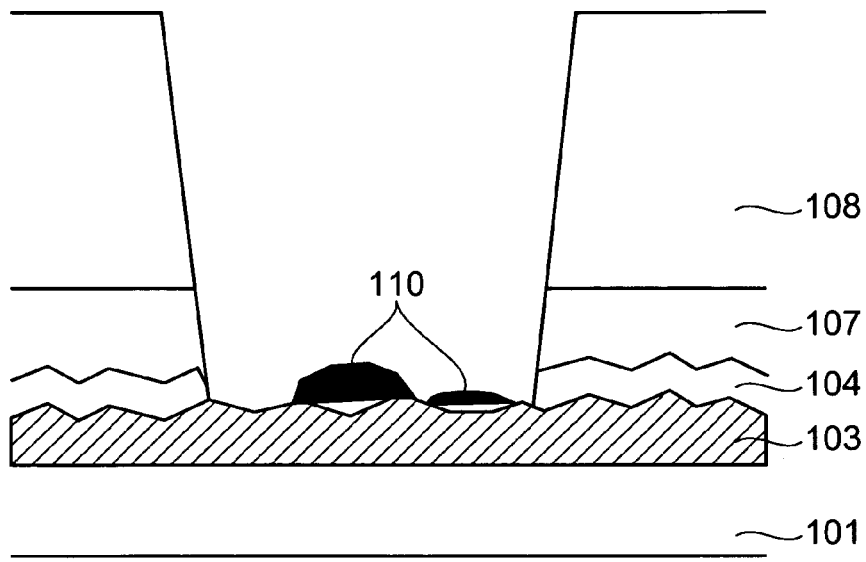
FIGS. 3 (a)~(b) are process sectional views illustrating the states of contact formation in the Si active layer area in the method for manufacturing a thin film transistor according to a first exemplary embodiment of the present invention.
Figure 3B:
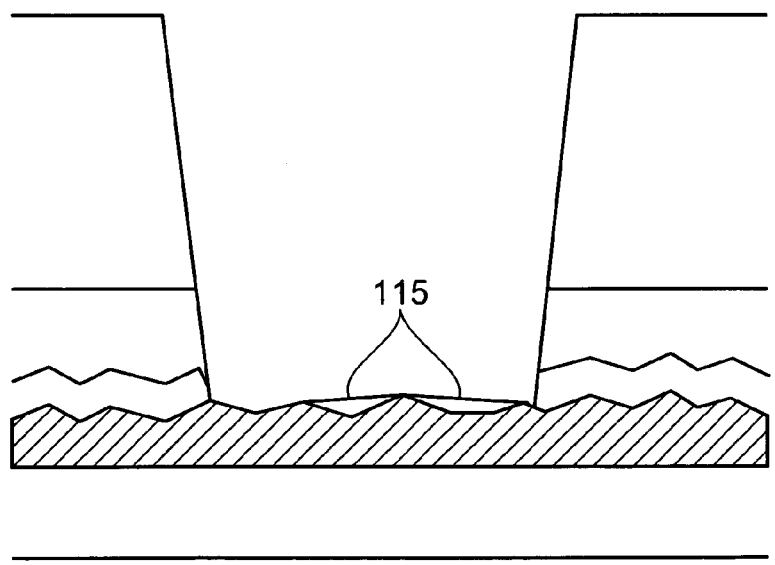
Figure 4A:
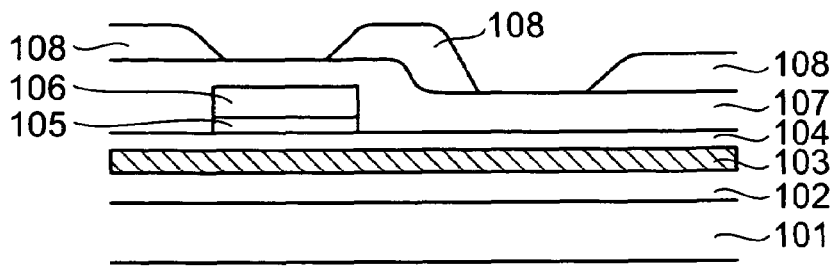
FIGS. 4 (a)~(e) are sectional views showing a thin film transistor formed using a method for manufacturing a thin film 1-5 transistor according to a second exemplary embodiment of the present invention.
Figure 4B:
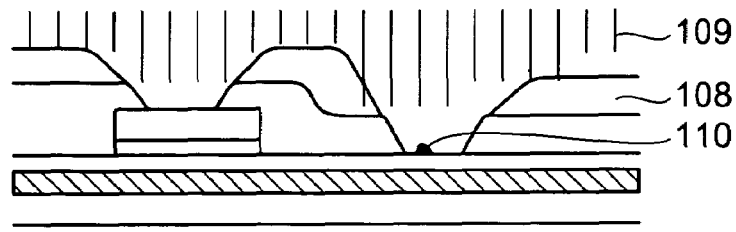
Figure 4C:
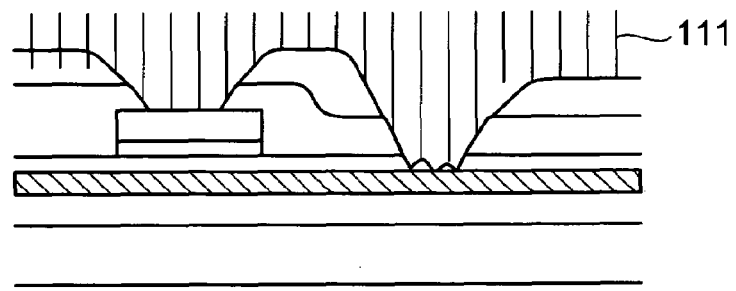
Figure 4D:
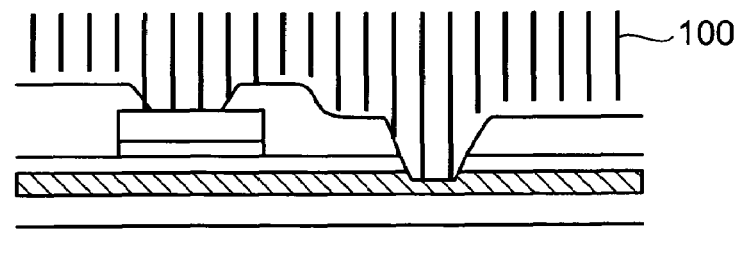
Figure 4E:
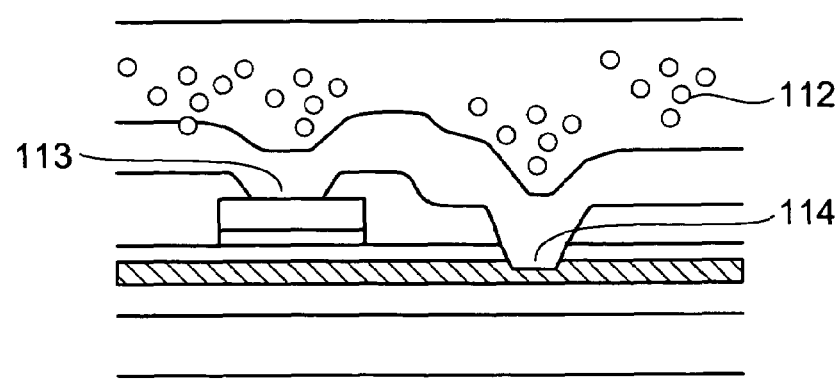
Figure 5A:
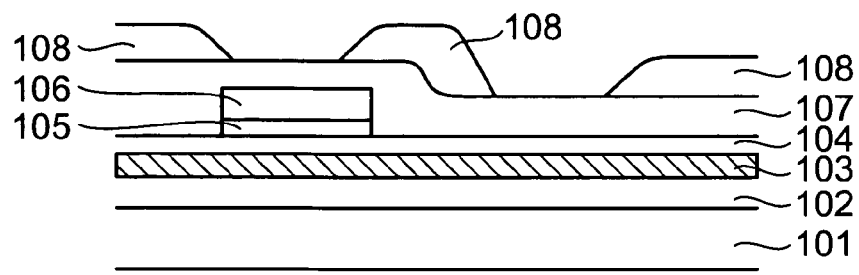
FIGS. 5 (a)~(d) are process sectional views illustrating the manufacturing flow of a thin film transistor formed using a method for manufacturing a thin film transistor according to a conventional method for manufacturing a thin film transistor.
Figure 5B:
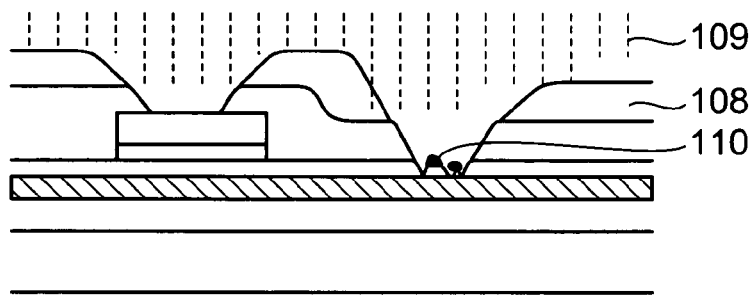
Figure 5C:
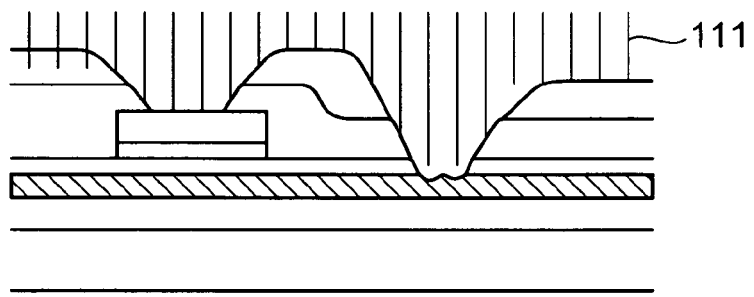
Figure 5D:
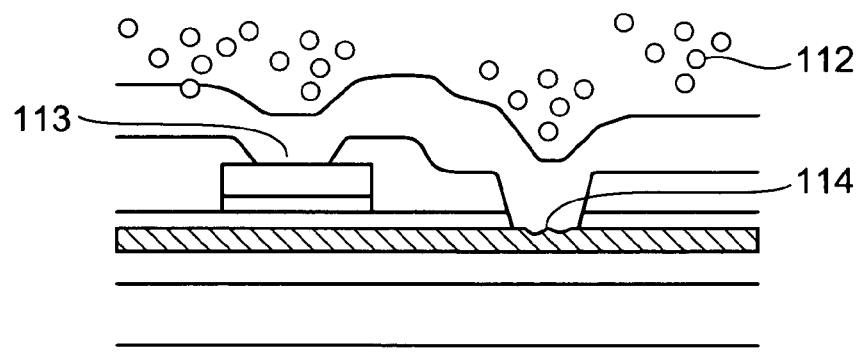
Figure 6A:
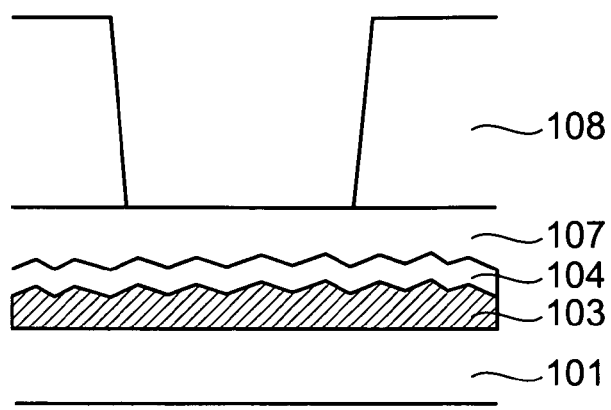
FIG. 6 (a)~(d) are process sectional view illustrating the states of contact formation in the Si active layer area in a conventional method for manufacturing a thin film transistor.
Figure 6B:
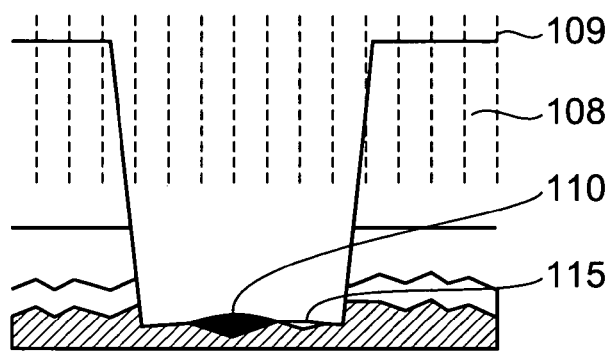
Figure 6C:
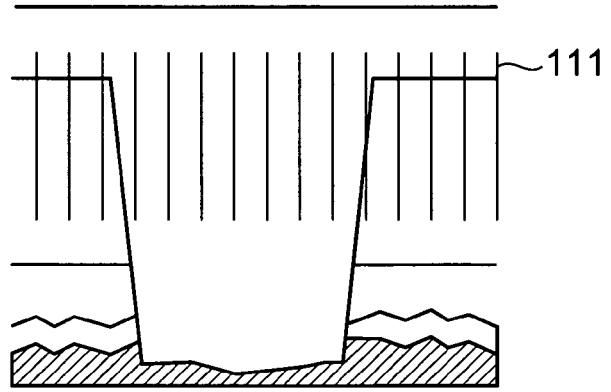
Figure 6D:
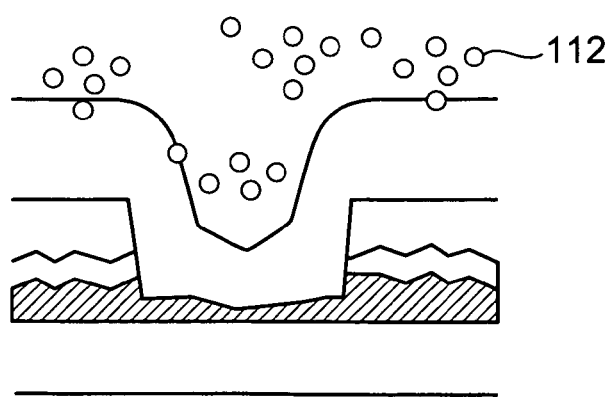
Figure 7:
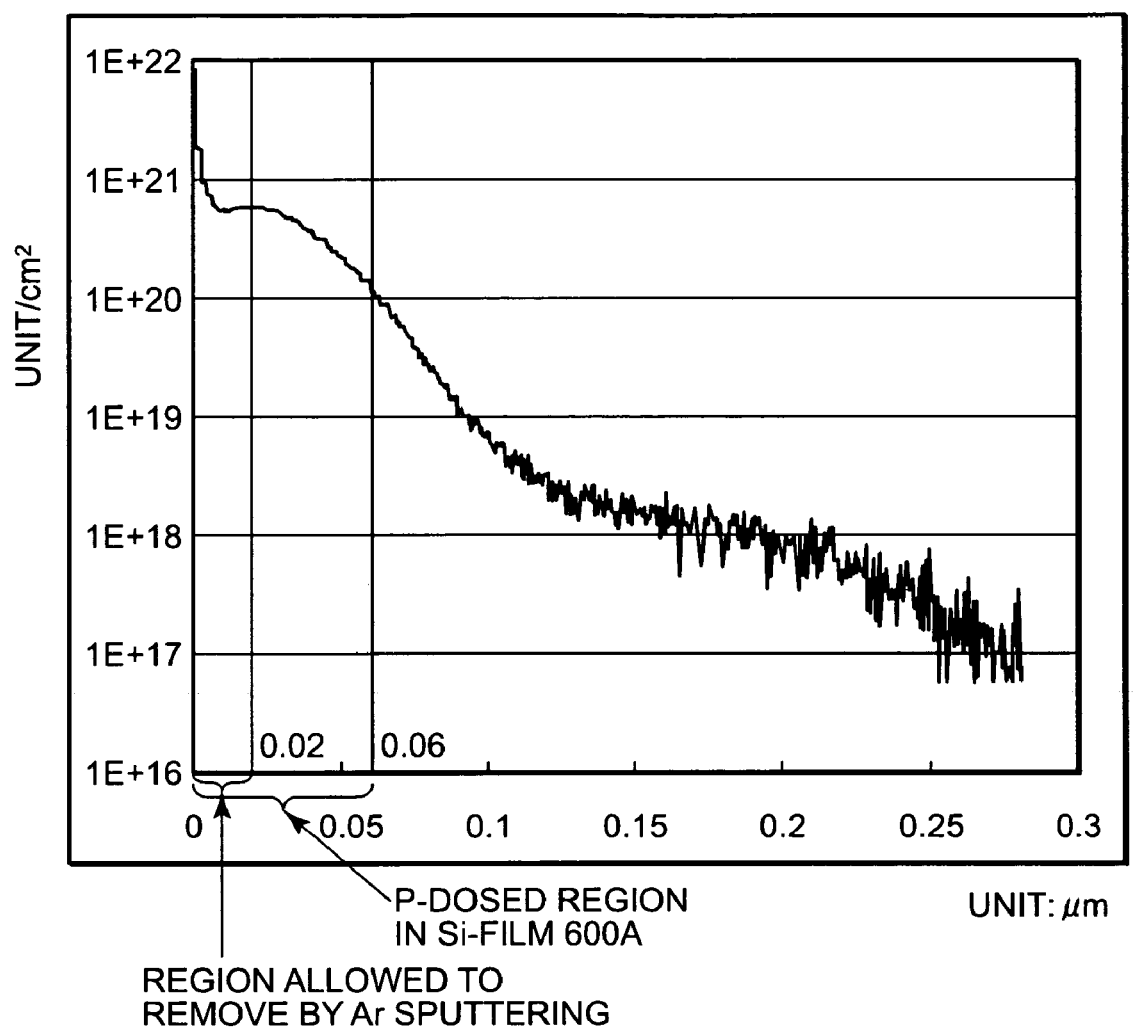
FIG. 7 is a diagram showing the distribution of impurities in an active layer Si film.

After the reactive etching, as the enlarged diagram in FIG. 3 (a) shows, fluorocarbon (FC)-based byproducts of the etching 110 formed by the etching gas are left behind on the surface of the active layer Si film 103 in the contact hole opening.

Therefore, to remove the byproducts of the etching 110, wet etching 111 using BHF as shown in FIG. 1 (c) is performed. The HF concentration in BHF was about 1%, and the etching time was 120 seconds. Since the etching rate for etching the Si oxide film is extremely higher than the etching rate for Si film in wet etching using BHF, only the residual Si oxide film can be removed without damaging the active layer Si film 103. An ammonium fluoride solution or the like can be added to the BHF as a buffer solution. However, since the Si oxide film cannot be completely removed from fine concave portions, at this time, as FIG. 3 (b) shows, the unexposed portions coated by residual Si oxide films 115 are present on the surface of the active layer Si film 103. Next, the glass substrate 101 is transferred to the etching chamber 201 of an AlSi sputtering apparatus shown in FIG. 2 using the transfer line while maintaining vacuum.

Here, after removal of the photoresist 108_, as FIG. 1 (d) shows, sputter etching 100 is performed on the surface of the active layer Si film 103, to remove the irregularity shown in FIG. 1 (c). In sputter etching, the surface layer is physically shaved by bombarding Ar molecules onto the surface. Therefore, since etching can be performed at a constant rate with little dependence on the materials, the Si film and the residual Si oxide film can be simultaneously removed, and the irregularity can be removed. The conditions at this time were a pressure in the chamber of 1 Pa and an RF power of 1000 W. The etching rate of Si is about 20 to 30 nm/min. On the other hand, since the height of convex portions is normally larger then 10 nm, and can be a maximum of 15 nm, the Si etching time for removing the residual Si oxide film in concave portions is preferably about 30 seconds.

Figure 2:
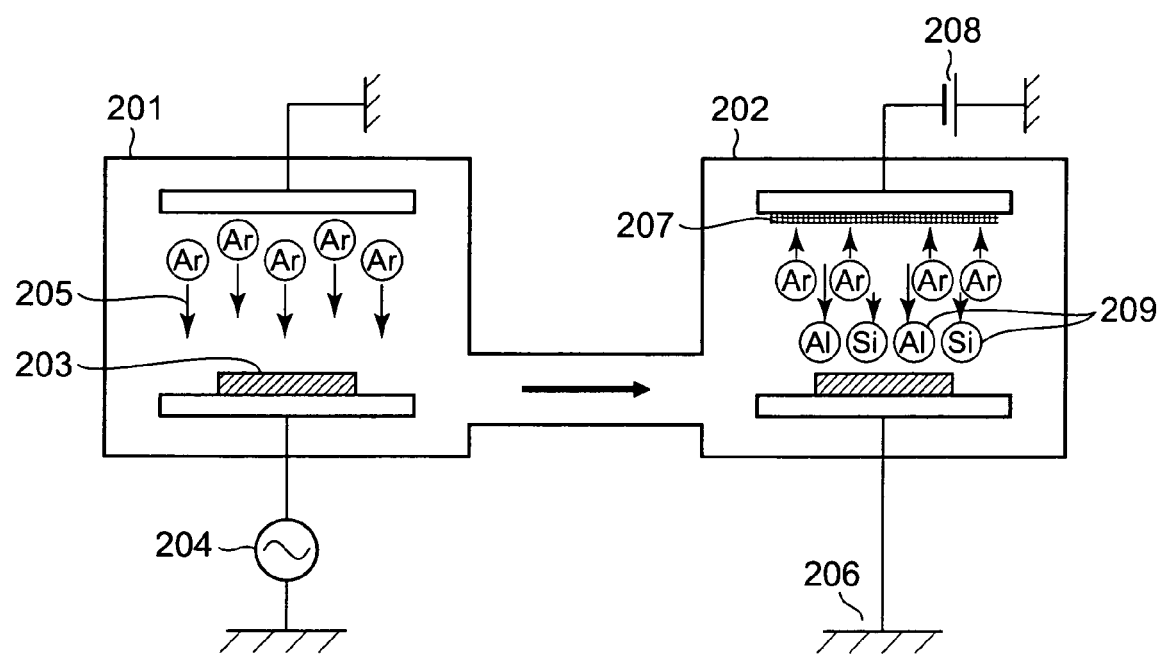
FIG. 2 is a schematic diagram showing an AlSi sputtering apparatus used in the method for manufacturing a thin film transistor according to the first exemplary embodiment of the present invention.

Thereafter, the glass substrate is transferred in the metal film sputtering chamber 202 in the AlSi sputtering apparatus shown in FIG. 2, and as FIG. 1 (e) shows, film-forming sputtering of AlSi 112 is performed. The conditions at this time may be a partial pressure of Ar of 0.3 Pa, a DC power of 20 kW, and a sputtering time of 60 seconds, to obtain a film thickness of 500 nm. Using such steps, the gate Cr/Al contact 113 is connected to the Si active layer/Al contact 114.

An AlSi sputtering apparatus used in the first exemplary embodiment will be described below. Referring to FIG. 2, an etching chamber 201 has a structure wherein an RF electrode 204 is disposed on the substrate side, which can etch off the under layer Si film 203 on the substrate at an accuracy of about 10 to 15 nm by physically colliding Ar radicals 205 produced by Ar gas plasma discharge onto the substrate.

On the other hand, a sputtering chamber 202 in which AlSi sputtering film deposition is performed has a structure wherein the substrate side is used as the ground electrode 206, and a DC bias electrode 208 is disposed on the counter electrode side for placing an AlSi target 207, Ar radicals 205 are produced from Ar gas plasma by the DC bias to sputter the AlSi target, and the sputter-emitted Al and Si atoms 209 can be deposited on the substrate.

Figure 8A:
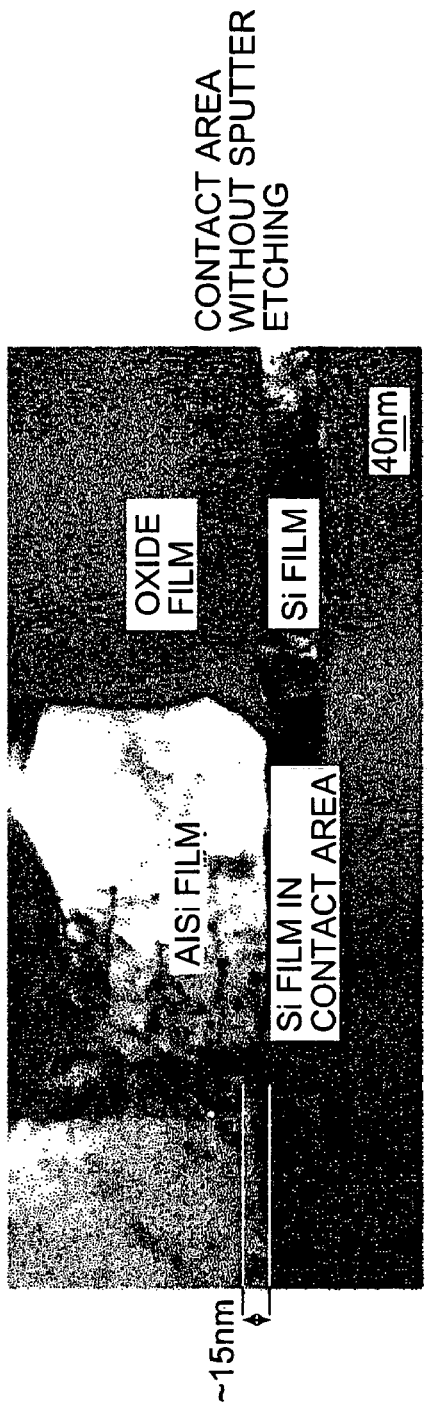
FIGS. 8 (a) and 8 (b) are a diagrams showing a sectional TEM image of a thin film transistor according to the first exemplary embodiment of the present invention.
Figure 8B:

By the use of the exemplary method and apparatus described herein, a favorable Si active layer/Al contact 114 and gate Cr/Al contact 113 shown in FIG. 1 (e) can be formed without leaving an Si oxide film on the surface of the underlying Si film 103. FIGS. 8 (a) and 8 (b) show sectional TEM photographs of a contact area without sputter etching and a contact area formed using sputter etching for 30 seconds. The irregularity of the surface of the underlying Si film 103 was planarized by sputter etching, and the height difference in the irregularity was 10 nm or less. The contact resistance was 10 kΩ or below, which was confirmed to be of a sufficiently small value for a driver of a display device.

Although a glass substrate is used in the first exemplary embodiment a quartz substrate can also be used. In the case of the quartz substrate, although the costs rise, since it contains no impurities, amorphous silicon can be directly formed there on without the necessity of a thermal oxide film on the substrate. The glass substrate can also be substituted by a sapphire substrate. Although the sapphire substrate is also more expensive than a glass substrate, it is suitable for use in an atmosphere wherein temperature rises, because sapphire has excellent thermal conductivity. Additionally a plastic substrate also may be used.

Although poly-Si is used as the amorphous silicon, the present invention is not limited thereto, but microcrystalline silicon may also be used.

Although $CHF_3$ and $O_2$ are used as the etchant gas in reactive ion etching in the first exemplary embodiment, the $CHF_3$ can be substituted by $CCl_4$.

Although an Al—Si film is used as the metallic film in the first exemplary embodiment, the materials are not limited thereto, but Au, Sn, Ag, Pt, Cu, Al, Mo, Cr or poly-Si can also be used.

In the first exemplary embodiment, although the transfer of the substrate from the etching chamber to the film-forming chamber through a transfer path-maintained at vacuum, the transfer path can also be filled with an inert gas such as Ar and He.

According to the present invention, since an irregularity in the surface of an amorphous Si is physically planarized by sputtering at high accuracy, and the sputtering of the metallic wiring is performed following this planarization, the oxide film left after the least required etching of the Si layer, and the natural oxide film can be removed, and a low-resistant contact can be formed on a clean Si surface.

Second Exemplary Embodiment

Next, as the second exemplary embodiment of the present invention, there will be described a method wherein the time of reactive ion etching is shortened, and the time of BHF wet etching having a high etching selection ratio of the Si/Si oxide film is lengthened, to further increase the accuracy of controlling the depth of contact holes.

FIG. 4 (a)-4 (e) show the second exemplary embodiment. Although the major part of the second embodiment is the same as the first embodiment, the endpoint of reactive ion etching is not the time when the underlying Si film 103 is exposed, but is the time when the surface of the Cr film 106 is exposed. The thickness of the insulating film on the Cr film 106 is 400 nm, and is 50 nm thinner than the insulating film on the underlying Si film 103.

Therefore, when the endpoint of etching is detected using the Cr film 106, the insulating film of a thickness of 50 nm remains on the underlying Si film 103, and the Si active layer/Al contact 114 is not opened. The time of etching endpoint in this case can be estimated from the etching time calculated from the etching rate in the same manner as in the first exemplary embodiment.

On the exposed Cr surface, since the reflectivity for visible light is significantly larger than on the Cr surface coated with the Si oxide film, the time of etching endpoint can also be estimated by observing the reflectivity for visible light on the Cr surface. The observation of the reflectivity can be visibly conducted, or the constitution wherein visible laser beams are irradiated onto the Cr pattern, and the reflected light is received using a light sensor, can also be used. To elevate the accuracy of such endpoint detection, a dummy film of the Cr film having a sufficiently larger area than the area of the contact hole can be formed on the substrate surface, and the reflectivity can be observed using this portion. Since BHF has an etching rate to Si oxide film more than 100 times larger than the etching rate to Si film, by switching to wet etching when the thickness of the film is at 50 nm the over-etching of Si can be reliably avoided compared with the method of the first exemplary embodiment. Since wet etching by BHF is not so isotropic as reactive ion etching, wet etching for a long time causes side etching, and the shape of the contact hole is degraded; however, the effect is little if wet etching is performed for the time that can etch the film thickness of about 50 nm.

In the first and second exemplary embodiments, although a silicon oxide film is used as an insulating film coating a substrate, or an interlayer film, a silicon nitride film can also be used. In this case also, methods and enchants well known to those skilled in the art can be used to perform reactive ion etching and liquid-phase etching, and the contact holes can be formed in the same manner.

Third Exemplary Embodiment

Figure 9:
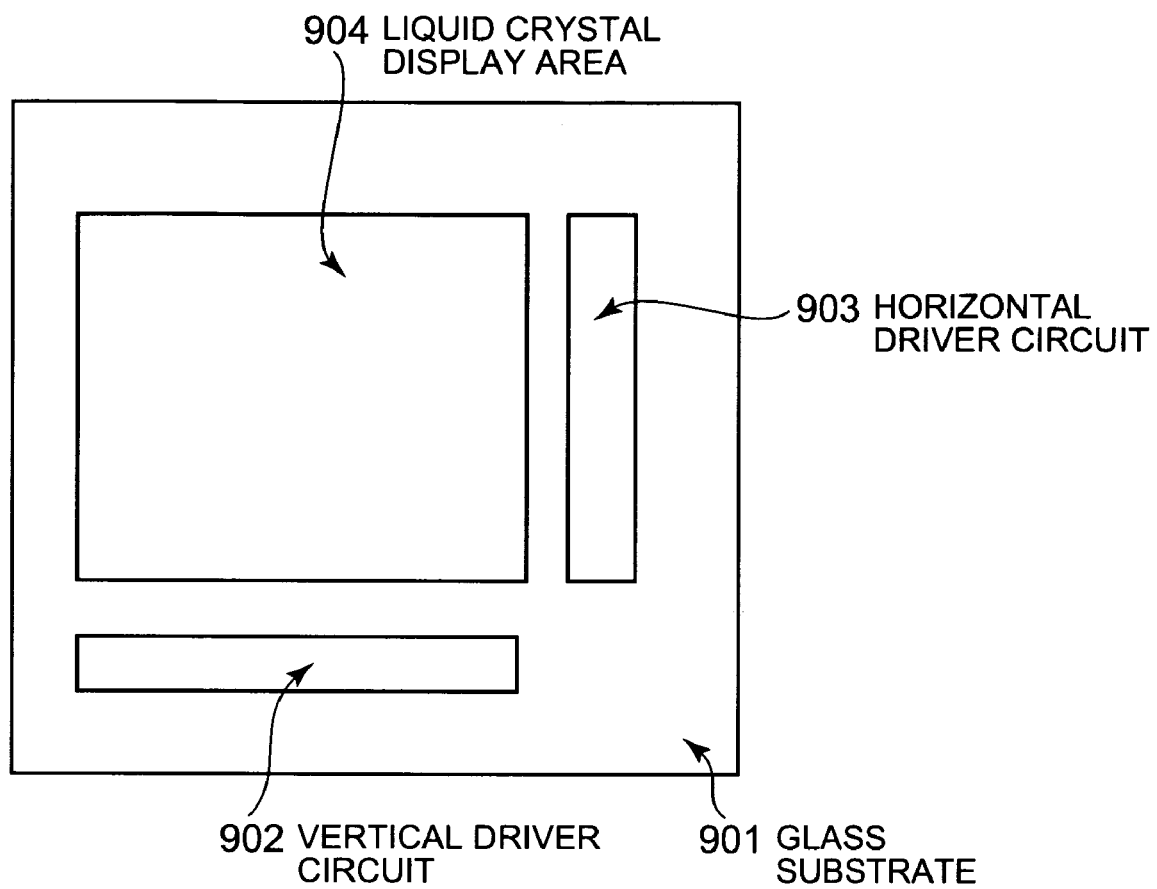
FIG. 9 is a diagram showing am exemplary liquid-crystal display using pixel driving device fabricated using the method of the present invention.

Next, as the third exemplary embodiment of the present invention, a liquid-crystal display using a pixel driving device fabricated using the method of the present invention is shown in FIG. 9. In the liquid-crystal display area 904 on a glass substrate 901, a TFT matrix using poly-Si is disposed as the pixel driving element, and images are displayed by scanning image signals using a horizontal drive circuit 903 and a vertical drive circuit 902. Using the contact holes formed by the exemplary method of the present invention, each TFT in the TFT matrix is connected to the power supply line, and favorable display characteristics can be obtained. Since the irregularity of the poly-Si surface on the bottom of the contact hole is 10 nm or less, and no oxide layers remain different from conventional structures wherein irregularity is larger than 10 nm, a low contact resistance can be realized.

Standard paragraph that the exemplary embodiments are only examples not limiting and alternatives and modifications may be made will the scope of claims.

Further, it is the inventor's intent to retain all equivalents of the claimed invention even if the claims are amended later during prosecution.

What is claimed is:

1. A method of forming a contact hole in an insulating film coating amorphous Si having an irregular surface formed on an insulating substrate, for connecting said amorphous Si to a conductor film formed on said insulating film, said method comprising:

etching said insulating film using reactive ion etching to a depth whereat said irregularity does not disappear;

removing a byproduct of said reactive ion etching using wet etching; and sputter-etching the surface of said amorphous Si.

2. The method of forming a contact hole according to claim 1, wherein buffered hydrofluoric acid is used as an etchant for said wet etching.

3. The method of forming a contact hole according to claim 1, wherein a fluorine-based gas is used in said reactive ion etching.

4. The method of forming a contact hole according to claim 1, wherein said insulating substrate comprises glass.

5. The method of forming a contact hole according to claim 1, wherein said insulating substrate comprises a plastic.

* * * * *